(12) United States Patent
Drebinger

(10) Patent No.: US 7,200,042 B2
(45) Date of Patent: Apr. 3, 2007

(54) METHOD AND CIRCUIT ARRANGEMENT FOR READING FROM A FLASH/EEPROM MEMORY CELL

(75) Inventor: Stephan Drebinger, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/230,301

(22) Filed: Sep. 19, 2005

(65) Prior Publication Data

US 2006/0067120 A1    Mar. 30, 2006

(30) Foreign Application Priority Data

Sep. 17, 2004   (DE) ...................... 10 2004 045 207

(51) Int. Cl.
*G11C 11/34* (2006.01)
(52) U.S. Cl. .............. 365/185.2; 365/185.03; 365/185.21
(58) Field of Classification Search ............. 365/185.2, 365/185.21, 185.23, 185.03, 189.09
See application file for complete search history.

(56) References Cited

U.S. PATENT DOCUMENTS

| | | | | |
|---|---|---|---|---|
| 5,889,699 A | * | 3/1999 | Takano ................... | 365/185.18 |
| 5,966,330 A | * | 10/1999 | Tang et al. .............. | 365/185.2 |
| 6,219,277 B1 | * | 4/2001 | Devin et al. ............ | 365/185.21 |
| 6,490,203 B1 | * | 12/2002 | Tang ...................... | 365/185.22 |
| 6,643,179 B2 | * | 11/2003 | Campardo et al. ..... | 365/185.21 |
| 6,735,733 B2 | * | 5/2004 | La Rosa .................. | 714/765 |
| 2002/0118576 A1 | | 8/2002 | Ohba et al. ............ | 365/189.07 |

* cited by examiner

*Primary Examiner*—Richard Elms
*Assistant Examiner*—Hien Nguyen
(74) *Attorney, Agent, or Firm*—Maginot, Moore & Beck

(57) ABSTRACT

The invention is based on a method for reading out the content of a flash/EEPROM memory cell, in which a read current flowing via a read-out path with a memory cell having a memory transistor is compared with a reference current flowing via at least one read-out path simulation with a reference memory cell that simulates the memory cell and has a reference memory transistor simulating the memory transistor. According to the invention, it is provided that firstly, in a first step, the reference memory transistor is brought to the normally on state provided that the reference memory transistor is not already in the normally on state. In a second step, it is provided that a predetermined reference current is fed into the at least one read-out path simulation. Unlike in the prior art, said reference current is not derived from a reference voltage. In a third step, provision is made for generating, with the aid of the predetermined reference current, a reference voltage that is dependent on the channel resistance of the reference memory transistor. In a fourth step, the reference voltage generated is applied to the gate of the memory transistor and the gate of the reference memory transistor. In a fifth step, the read current flowing through the memory transistor is compared with the predetermined reference current flowing through the reference memory transistor.

19 Claims, 6 Drawing Sheets

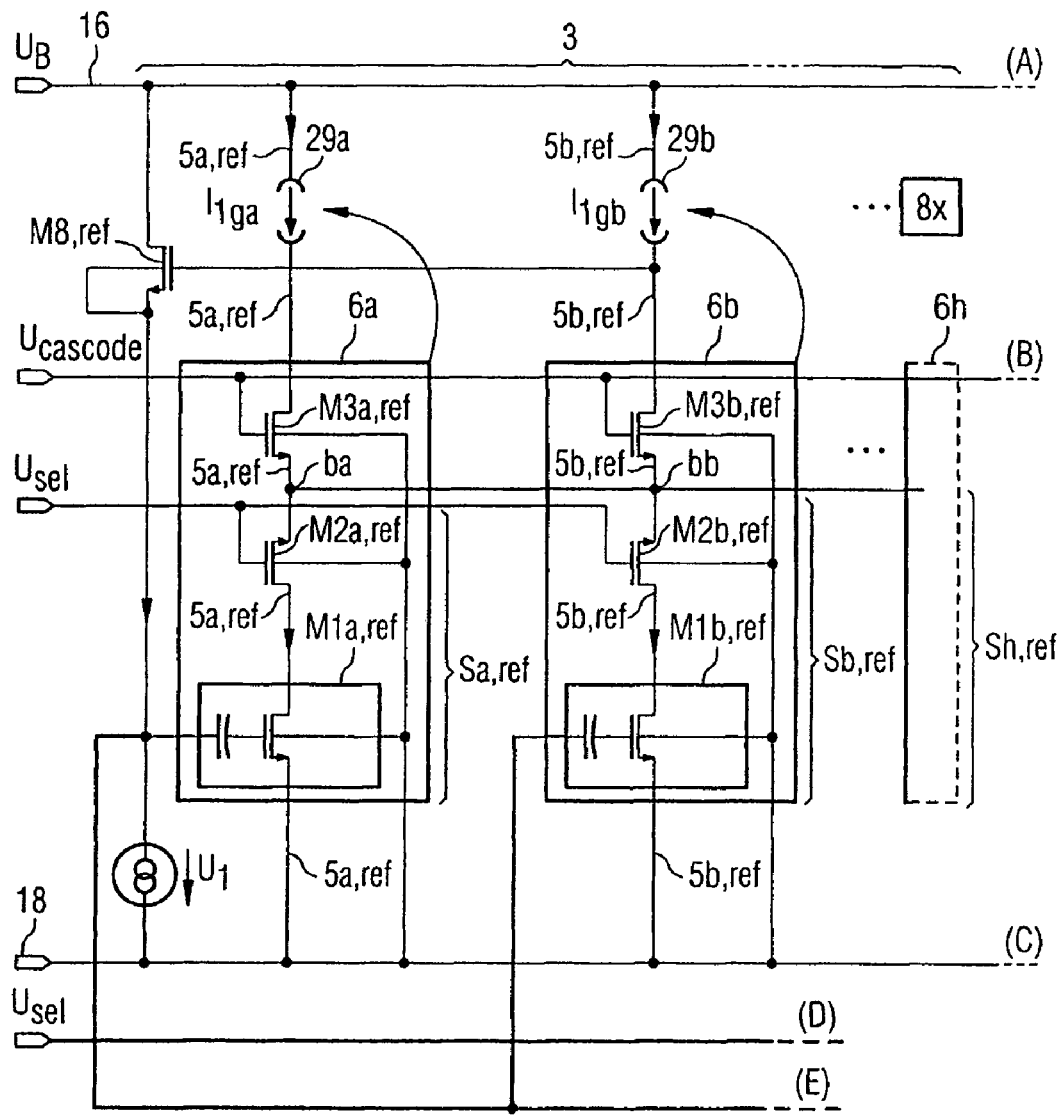

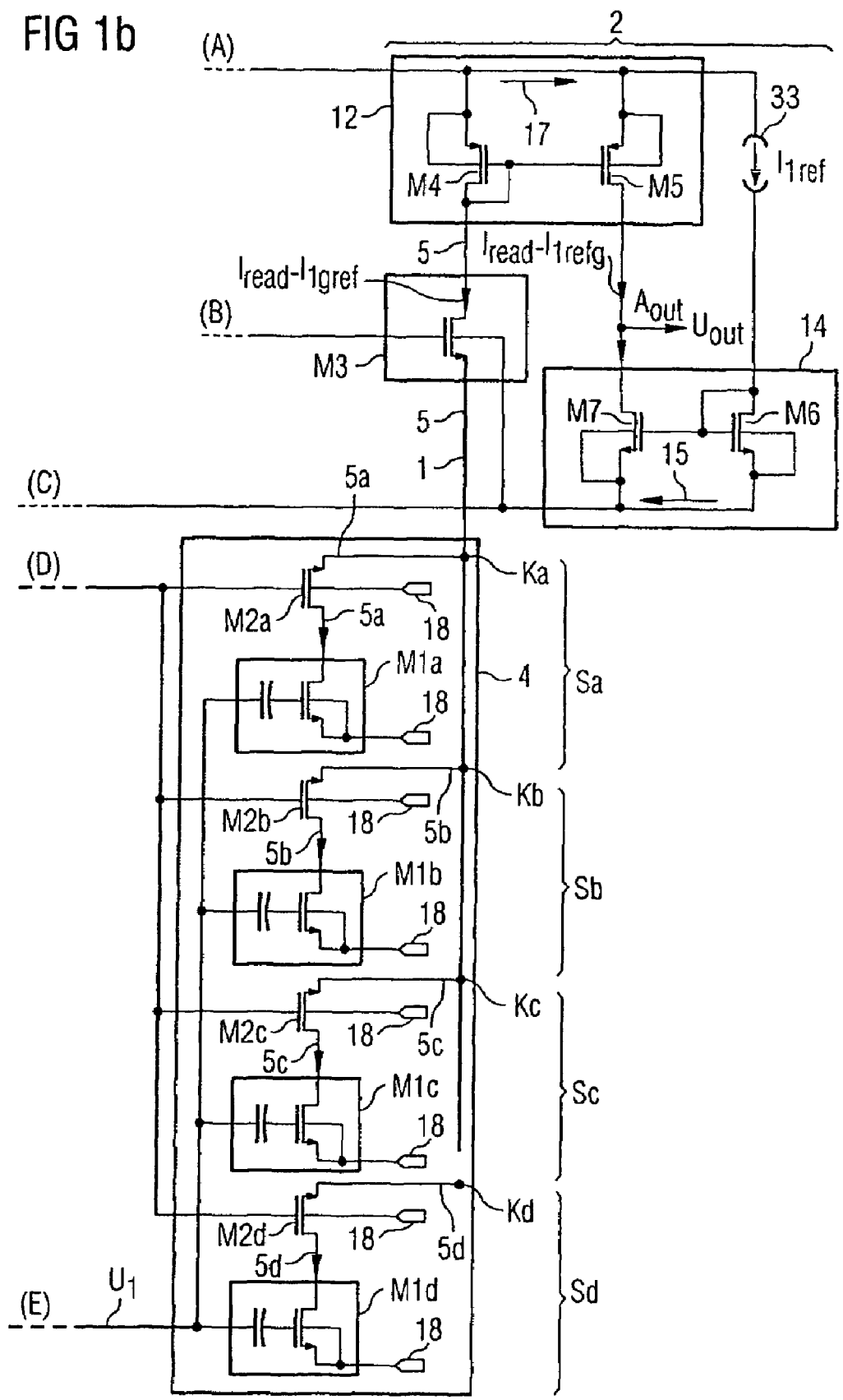

METHOD AND CIRCUIT ARRANGEMENT FOR READING FROM A FLASH/EEPROM MEMORY CELL

FIELD OF THE INVENTION

The invention relates to a method for reading from a flash/EEPROM memory cell according to the preamble of patent claim 1 and to a circuit arrangement for reading 10 from a flash/EEPROM memory cell according to the preamble of patent claim 8.

BACKGROUND

EEPROMs (acronym for Electrically Erasable Programmable Read Only Memories) or EAROMs (acronym for Electrically Alterable ROM=electrically alterable read only memo-ries), so-called flash memories, are known in a variety of embodiment variants from the prior art. EEPROM/flash memories are generally divided into rows and columns, each crossover point of columns and rows constituting a memory cell.

The respective columns of an EEPROM/flash memory are referred to as bit lines. These bit lines are terminated by a so-called sense amplifier. Said sense amplifier serves for evaluating the content of a respec-tively selected memory cell.

By way of example, a so-called 1 kbit memory comprises a total of 1024 individual EEPROM/EAROM memory cells with 32 rows and 32 columns or bit lines. Each bit line is assigned a sense amplifier, so that the 1 kbit memory has a total of 32 sense amplifiers. Each bit line in the memory array thus comprises, in accordance with the number of rows, 32 individual EEPROM/EAROM memory cells which are connected in parallel and with which a single sense amplifier is in each case connected in series.

In addition to the actual memory, which is usually formed by a memory transistor, each EEPROM/EAROM memory cell comprises a selection device, preferably a high-voltage switching transistor, by means of which the EEPROM/EAROM memory cell can be selected. In addition to the function of activating the read-out path, the selection device, in particular the high-voltage switching transistor, serves as a high-voltage protection device for the sense amplifier during erasure.

A sense amplifier comprises a comparison device, which compares the current intensity of a current flowing via the selected EEPROM/EAROM memory cell with that of a reference current and outputs a logic "0" or "1", on the basis of the result of the comparison (the current intensity via the selected EEPROM/EAROM memory cell is greater or less than the reference current intensity).

There is often additionally present in each bit line a circuit device, which is usually formed as a so-called cascode transistor, which is provided for preventing "floating" of the bit line, that is to say for setting a defined potential on the bit line even when the bit line is not selected, and furthermore for increasing the read-out speed of the sense amplifier.

The read-out process is explained below with reference to FIG. 4 of the drawing.

FIG. 4 shows a sense amplifier 2 connected to a bit line 1 with a single memory cell S.

In accordance with the explanations above, the memory cell S comprises a memory transistor M1 with a floating gate (not illustrated here) and a high-voltage switching transistor M2 (in each case n-channel MOSFETs of the enhancement-mode type, MOSFET=acronym for Metal Oxide Semiconductor Field Effect Transistor), the drain-source channels D1, S1, D2, S2 of which are connected in series, the drain D1 of the memory transistor M1 being connected to the drain D2 of the high-voltage switching transistor M2.

In accordance with the explanations above, the sense amplifier 2 comprises a cascode transistor M3 (n-channel MOSFET of the enhancement-mode type), a current comparator 22 and two current mirrors 12 and 14.

Each current mirror 12, 14 is formed, in a manner that is customary per se, with the aid of two transistors M4, M5 (p-channel MOSFETs of the enhancement-mode type) and M6, M7 (n-channel MOSFETs of the enhancement-mode type), respectively, whose gates G4, G5 and G6, G7, respectively, are connected to one another and in the case of whose respective input-side transistor M4, M6 the gate G4, G6 is connected to the drain D4, D6.

The current comparator 22 is essentially formed by the two output-side transistors M5, M7 of the abovementioned current mirrors 12, 14, the drain D5 of the output-side transistor M5 of the current mirror 12 being connected to the drain D7 of the output-side transistor M7 of the current mirror 14.

The individual circuit blocks mentioned above are connected up to one another as follows:

The source S2 of the high-voltage switching transistor M2 of the memory cell S is connected to the source S3 of the cascode transistor M3. The drain D3 of the cascode transistor M3 is connected to the drain D4 of the input-side transistor M4 of the first current mirror 12. The substrate terminals B1, B2, B3, B6, B7 of all the NMOS transistors M1, M2, M3, M6, M7 each having a drain, source, gate and substrate terminal D1, D2, D3, D6, D7, S1, S2, S3, S6, S7, G1, G2, G3, G6, G7, B1, B2, B3, B6, B7 are in each case connected to a reference potential 18. The substrate terminals B4, B5 of the PMOS transistors M4, M5 each having a drain, source, gate and substrate terminal D4, D5, S4, S5, G4, G5, B4, B5 are at operating voltage $U_B$.

The source S1 of the memory transistor M1 of the memory cell S and also the source terminals S6, S7 of the two transistors M6, M7 of the second current mirror 14 are at the reference potential 18. The two source terminals S4, S5 of the transistors M4, M5 of the first current mirror 12 are at the operating voltage $U_B$ provided by an operating voltage source 16. The operating voltage $U_B$ is generally approximately 5 V. A cascode voltage $U_{cascode,\,21}$ provided by a cascode voltage source 21 is present at the gate G3 of the cascode transistor M3. The cascode voltage $U_{cascode,21}$ is dependent on the state of the memory cells. It is typically approximately 1.9 V in the control state. A fixedly predetermined drive voltage having a magnitude of typically $U_{ref}=1.25V$ (e.g. bandgap voltage) which is provided by a voltage source 19 is present at the gate G1 of the memory transistor M1. Interposed between the reference potential 18 and the source S2 of the high-voltage switching transistor M2 is a current sink 34 with a current $I_2$, which holds the cascode transistor M3 at the operating point, which is intended to prevent "floating" of the bit line.

The read-out of the memory cell S, and in particular of the content of the memory transistor M1, is effected in accordance with the description below:

The memory cell S is selected as a result of the gate G2 of the high-voltage switching transistor M2 being driven with a selection voltage $U_{sel}$ provided by a selection voltage source 20. The high-voltage switching transistor M2 is in the on state. As a result, a read current $I_{read}$ driven by the operating voltage $U_B$ flows through the read-out path 5 formed by the drain-source paths D4, S4, D3, S3, D2, S2, D1, S1 of the transistors M4, M3, M2, M1. The read current intensity $I_{read}$ is determined by the threshold voltage $U_{th,M1}$ of the memory transistor M1, which was set by preceding erasure (normally on state of the transistor M1 is necessary for current flow). A reference current $I_{ref}$ provided by a reference current source 7 simultaneously flows in the opposite direction.

The read current $I_{read}$ predetermined by the memory transistor M1 and the reference current $I_{ref}$ flowing in the opposite direction are mirrored (mirror direction 17) with the aid of the first current mirror 12 into the comparator current path 23 formed by the source-drain path S5, D5 of the output-side mirror transistor M5 of the first current mirror 12 and the source-drain path S7, D7 of the output-side mirror transistor M7 of the second current mirror 14 and are ready there as mirrored differential current $(I_{read}-I_{ref})_g$. At the same time, the reference current $I_{ref}$ provided by the reference current source 7 is mirrored (mirror direction 15) with the aid of the second current mirror 14 into the comparator current path 23 formed by the source-drain path S5, D5 of the output-side mirror transistor M5 of the first current mirror 12 and the source-drain path S7, D7 of the output-side mirror transistor M7 of the second current mirror 14 and is ready there as mirrored reference current $I_{ref,g}$.

If $I_{read}=0$, it follows that $(I_{read}-I_{ref})_g=I_{ref,g}<0$. In this case, the output voltage $U_{out}=0$ is present at the drain D5 of the output-side mirror transistor M5 of the first current mirror 12 and the sense amplifier 2 outputs a logic "0". If $I_{read}>I_{ref}$, it follows that $(I_{read}-I_{ref})_g=I_{ref,g}>0$. In this case, the operating voltage $U_B$ is dropped across the mirror transistor M7 and the comparator output $A_{out}$ is at operating or supply voltage $U_{out}=U_B$ and the sense amplifier 2 outputs a logic "1".

A reference circuit arrangement 3* for generating the reference current $I_{ref}$ that is usually used according to the prior art is illustrated in FIG. 5.

The reference circuit arrangement 3* for generating the reference current $I_{ref}$ essentially comprises a simulation of the read-out path 5 of the circuit arrangement according to FIG. 4 that is formed by the drain-source paths D4, S4, D3, S3, D2, S2, D1, S1 of the transistors M4, M3, M2, M1.

In concrete terms, the reference circuit arrangement 3* according to the prior art comprises a reference memory transistor M1,ref and a reference high-voltage switching transistor M2,ref, which together form a reference memory cell $S_{ref}$, a reference cascode transistor M3,ref and a current mirror 10 corresponding to the type described above with two p-channel MOS field effect transistors M4,ref, M5,ref of the enhancement-mode type.

The gates G4,ref and G5,ref of the two field effect transistors M4,ref, M5,ref of the current mirror 10 are connected to one another. The gate G4,ref of the input-side transistor M4,ref is connected to the drain D4,ref thereof.

The source S2,ref of the reference high-voltage switching transistor M2,ref of the reference memory cell $S_{ref}$ is connected to the source S3,ref of the reference cascode transistor M3,ref. The drain D3,ref of the reference cascode transistor M3,ref is connected to the drain D4,ref of the input-side transistor M4,ref of the current mirror 10. The substrate terminals B1,ref, B2,ref, B3,ref of all the NMOS transistors M1,ref, M2,ref, M3,ref each having a drain, source, gate and substrate terminal D1,ref . . . D3,ref, S1,ref . . . S3,ref, G1,ref . . . G3,ref, B1,ref . . . B3,ref are connected to the reference potential 18. The substrate terminals B4,ref, B5,ref of all the PMOS transistors each having a drain, source, gate and substrate terminal D4,ref, D5,ref, S4,ref, S5,ref, G4,ref, G5,ref B4,ref, B5,ref are connected to the operating voltage potential $U_{B,ref}$.

The source S1,ref of the reference memory transistor M1,ref of the reference memory cell $S_{ref}$ is at the reference potential 18. The two source terminals S4,ref, S5,ref of the transistors M4,ref, M5,ref of the reference current mirror 10, in the same way as the gate G2,ref of the reference high-voltage switching transistor M2,ref, are at an operating voltage $U_{B,ref}$ provided by a reference operating voltage source 11, said operating voltage being identical to that from the operating voltage source $U_B$ of the sense amplifier 2. The operating voltage $U_B=U_{B,ref}$ is generally approximately 5 V. A cascode voltage $U_{cascode,9}$ provided by a reference cascode voltage source 9 is present at the gate G3,ref of the reference cascode transistor M3. Said cascode voltage $U_{cascode,9}$ is typically $U_{cascode,9}=1.9$ V in the control state, as above. A fixedly predetermined reference drive voltage $U_{ref}$ provided by a voltage source 8 can be applied to the gate G1,ref of the reference memory transistor M1,ref, said reference drive voltage being chosen to be identical to the drive voltage $U_{ref}$ in the circuit arrangement 2 according to FIG. 4.

The reference current $I_{ref}$ is generated by a current $I_{ref,0}$ flowing via the reference memory transistor M1,ref on account of the voltage drop across the read-out path simulation 5ref formed by the source-drain paths S1,ref, D1,ref, S2,ref, D2,ref, S3,ref, D3,ref, S4,ref, D4,ref of the reference transistors M1,ref, M2,ref, M3,ref, M4,ref. Said current $I_{ref,0}$ is mirrored (mirror direction 13) with the aid of the reference current mirror 10 from the input-side transistor M4,ref to the output-side mirror transistor M5,ref. The current flowing through the mirror transistor M5,ref forms the reference current $I_{ref}$, which can be tapped off at the drain D5,ref of the mirror transistor M5,ref. This terminal representing the actual reference current source is identified by the reference symbol 7 in FIG. 5.

In order to set the reference current $I_{ref}$ to a desired value, the so-called target current intensity $I_{target}$, the reference memory transistor M1,ref is brought to the normally on state by erasure.

The threshold voltage $U_{th,M1,ref}$ of the reference memory transistor M1,ref, which can be altered by means of the erasure, is responsible for the current-carrying capacity of the reference EEPROM/EAROM cell:

erasure with a high erase voltage means a strongly negative threshold voltage $U_{th,M1,ref}$. The channel of the reference memory transistor M1,ref is strongly normally on.

erasure with a low erase voltage means a weakly negative threshold voltage $U_{th,M1,ref}$. The channel of the reference memory transistor M1,ref is weakly normally on.

This influence of the erase voltage on the current-carrying capacity of the reference memory cell $S_{ref}$ or the reference memory cells (typically a total of eight reference memory cells of the type illustrated in FIG. 5 are used for generating the reference current for the entire memory, said reference memory cells being connected in parallel) is utilized in the customary principle of reference current generation. In this case, the reference memory cell(s), which are generally all situated on the same semiconductor chip, is/are trimmed to the target current $I_{target}$ during testing by the cycle erasure—current measurement, said target current being fed into the sense amplifier 2 as reference current $I_{ref}$.

The erasure of the reference memory cell(s) $S_{ref}$ is effected by the gate G1,ref of the reference memory transistor M1,ref being put at reference potential 18 and the source S1,ref of the reference memory transistor M1,ref momentarily having a high voltage of the erase voltage, applied to it. Said voltage is generally approximately 20 V.

For the subsequent current measurement, a defined reference voltage $U_{ref}$ (e.g. the bandgap voltage of approximately 1.25 eV) is applied to the gate G1,ref of the EEPROM cell M1,ref (illustrated in FIG. 5).

If the desired target current intensity $I_{target}$ is not reached after the first cycle, that is to say if the measured current intensity $I_{meas}$ is less than the target current intensity $I_{target}$, erasure is effected once again, but this time with a high erase voltage. The consequence of this is that the magnitude of the threshold voltage $U_{th,M1,ref}$ decreases and the cell current $I_{ref,0}$ rises. This adjustment may last for a few cycles until the target current $I_{target}$ is reached. The reference cell $S_{ref}$ then remains untouched over the lifetime.

Although the method described above and also the circuit arrangement illustrated in FIG. 5 have basically proved to be worthwhile, various weak points still exist.

In particular, the reference current is a current trimmed to an absolute value and is therefore greatly dependent on the state of the reference cells. As a result of the complicated current adjustment during testing, the process dependence, that is to say the variation of the component properties on account of certain production tolerances, can be eliminated for the most part.

During the lifetime of the EEPROM, the so-called "floating gate" of the memory transistor loses charge, which leads to a threshold voltage increase and thus to a lower current-carrying capacity of the memory cell.

This process is known as "data retention". In order to be able to maintain the required read-out speed over the lifetime of the EEPROM, it is necessary to allow for a certain bias in the dimensioning of the threshold voltage. This has the effect that the overall current consumption rises. This results from the relationship whereby the magnitude of the threshold voltage during erasure is proportional to the read-out current and thus proportional to the read-out time.

Moreover, temperature changes and operating voltage fluctuations cause in some instances considerable fluctuations of the reference current.

In order to set the reference current correctly despite all the influences, complicated technological examinations are necessary over the "operating window" of the EEPROM cells.

SUMMARY

The object of the invention consists, then, in providing a method and a circuit arrangement for reading from an EEPROM memory cell in the case of which the abovementioned problems are largely eliminated.

The invention is based on a method for reading out the content of a flash/EEPROM memory cell, in which a read current flowing via a read-out path with a memory cell having a memory transistor is compared with a reference current flowing via at least one read-out path simulation with a reference memory cell that simulates the memory cell and has a reference memory transistor simulating the memory transistor.

According to the invention, it is provided that firstly the reference memory transistor is brought to the normally on state provided that the reference memory transistor is not already in the normally on state. It is further provided that a predetermined reference current is fed into the at least one read-out path simulation. Unlike in the prior art, said reference current is not derived from a reference voltage. In this case, provision is made for generating, with the aid of the predetermined reference current, a reference voltage that is dependent on the channel resistance of the reference memory transistor, in particular in triode operation a reference voltage that is (essentially) proportional to the channel resistance and/or in saturation operation a reference voltage that (essentially) rises with the channel resistance according to a root function. In this case, the reference voltage generated is applied to the gate of the memory transistor and the gate of the reference memory transistor. Finally, the read current flowing through the memory transistor is compared with the predetermined reference current flowing through the reference memory transistor.

In terms of the apparatus, the invention is characterized by the fact that, if appropriate, means are provided in order to bring the reference memory transistor to the normally on state (that is to say low threshold voltage) provided that the reference memory transistor is not already in the normally on state (that is to say threshold voltage low). A current source is provided in order to feed a predetermined reference current into the at least one read-out path simulation. A circuit device is furthermore provided in order to generate, with the aid of the predetermined reference current, a reference voltage that is dependent (e.g. proportional or rising according to a root function) on the channel resistance of the reference memory transistor and in order to apply the reference voltage generated to the gate of the memory transistor and the gate of the reference memory transistor, the comparison device, in accordance with the invention, being provided for comparing the read current flowing through the memory transistor, with the predetermined reference current flowing through the memory reference transistor.

In a simple manner, the reference memory transistor can be brought to the normally on state by the gate of the reference memory transistor being connected to a reference potential and an erase voltage of e.g. 20 V being applied momentarily, in particular multiply, to the source of the reference memory transistor. The circuit arrangement according to the invention, correspondingly comprises means which are designed to bring the reference memory transistor to the normally on state by connecting the gate of the reference memory transistor to a reference potential and applying an erase voltage momentarily, in particular multiply, preferably three times, to the source.

For reasons of reliability and secure operation, it has proved to be advantageous if the predetermined reference current is fed into a plurality of read-out path simulations. The provision of eight read-out path simulations constitutes a compromise between high operational reliability and comparatively low redundancy and current consumption.

For reasons of accuracy, it has proved to be expedient if the predetermined reference current is mirrored before being fed into the at least one read-out path simulation. The apparatus according to the invention has, for this purpose, a current mirror in order to mirror the predetermined reference current before being fed into the at least one read-out path simulation.

The reference voltage that is dependent on the channel resistance of the reference memory transistor can be generated most simply with the aid of a voltage follower circuit, e.g. a source follower transistor or with the aid of an emitter follower transistor. The concrete circuitry realization can be gathered from the description of the figures below.

Furthermore, it has proved to be advantageous for reasons of accuracy if the read current flowing through the memory transistor and the predetermined reference current flowing through the reference memory transistor are mirrored before they are compared. The apparatus according to the invention comprises, for this purpose, a current mirror in order to mirror the read current flowing through the memory transistor and a current mirror in order to mirror the predetermined reference current flowing through the reference memory transistor. The comparison device is provided for comparing the mirrored read current and the mirrored predetermined reference current.

In the case of the method according to the invention and the apparatus according to the invention, it is necessary in the majority of cases, with the aid of a cascode transistor, the gate of which is driven by means of a cascode voltage, to set a defined potential at an input node of the memory cell, preferably at the source of the high-voltage switching transistor. The same also applies to the simulated read-out path, where, with the aid of a respective corresponding reference cascode transistor simulating the cascode transistor, the gate of which reference cascode transistor is driven by means of the cascode voltage, a defined potential is set at an input node of a respective reference memory cell.

In a particularly advantageous embodiment variant of the invention, it is provided that the cascode voltage is generated by a predetermined current being fed into a further read-out path simulation with a further simulated memory cell. The further simulated memory cell has a further input node, to which a further simulated cascode transistor and a control transistor are connected. The control transistor simulates a memory transistor. The voltage at the input node of a respective reference memory cell is compared with the voltage at the further input node of the further simulated memory cell, and, through corresponding driving of the gate of the control transistor, the channel conductivity of the control transistor is altered until the voltage at the input node of a respective reference memory cell matches the voltage at the further input node. The voltage at the drain of the further simulated cascode transistor is used as the cascode voltage.

A cascode voltage generating device according to the invention for generating a cascode voltage accordingly comprises a current source in order to feed a predetermined current into a further read-out path simulation. Furthermore, a comparison and control device is provided in order to compare the voltage at the input node of a respective reference memory cell with the voltage at the further input node of the further simulated memory cell. The comparison and control device is further designed, through corresponding driving of the gate of the control transistor, to alter the channel conductivity of the control transistor until the voltage at the input node of a respective reference memory cell matches the voltage at the further input node. An output device is present in order to output the voltage at the drain of the further simulated cascode transistor as the cascode voltage.

BRIEF DESCRIPTION OF THE DRAWINGS

The invention will now be described in more detail with reference to the drawing, in which:

FIG. 1 shows a circuit arrangement comprising a bit line with four EEPROM memory cells, a sense amplifier for reading out the content of the EEPROM memory cellsα and a first exemplary embodiment of a reference circuit arrangement according to the invention with eight reference sub-circuit arrangements for reading from the EEPROM memory cells,
  a) left-hand part
  b) right-hand part

DETAILED DESCRIPTION

Identical, functionally identical or functionally similar components are provided with identical reference symbols in all the abovementioned figures.

The invention will firstly be explained with reference to FIG. 2, which shows an exemplary embodiment of a reference circuit arrangement 3 according to the invention for generating a reference voltage U1 for reading from EEPROM memory cells S.

Figure 4:
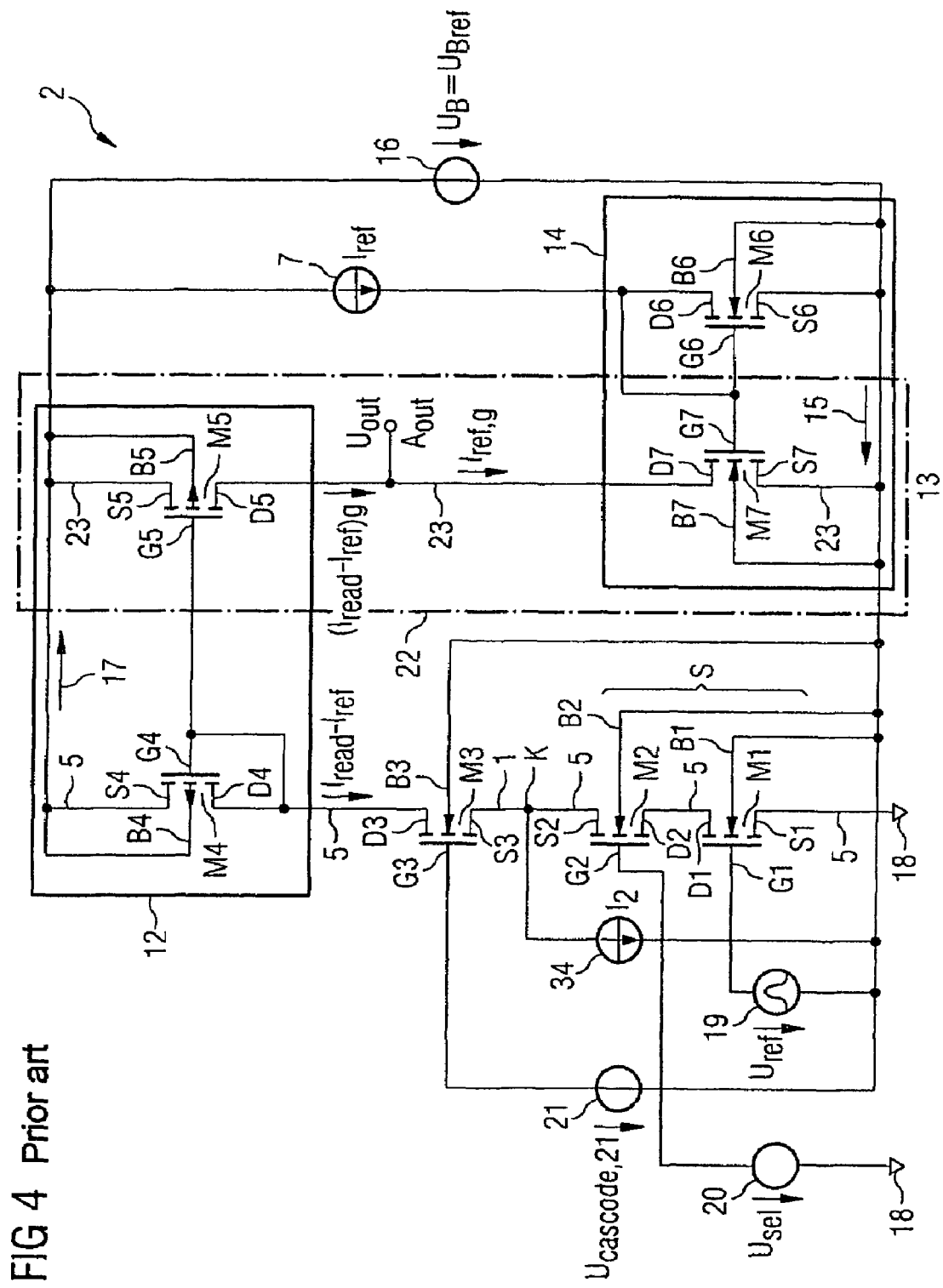
FIG. 4 shows a simple sense amplifier in accordance with the prior art for reading out the content of EEPROM memory cells.

The starting point is once again a sense amplifier 2 in accordance with the prior art with an EEPROM memory cell S, such as is illustrated in FIG. 4 and described in detail above.

As in the reference circuit arrangement 3* in accordance with the prior art, the reference circuit arrangement 3 according to the invention for generating a reference voltage $U_1$ comprises a simulation 5ref of the read-out path 5 of the circuit arrangement 2 according to FIG. 4 that is formed by the drain-source paths D4, S4, D3, S3, D2, S2, D1, S1 of the transistors M4, M3, M2, M1.

In concrete terms, the reference circuit arrangement 3 comprises a reference memory transistor M1,ref (n-channel MOSFET of the enhancement-mode type) and a reference high-voltage switching transistor M2,ref (n-channel MOSFET of the enhancement-mode type), which together form a reference memory cell $S_{ref}$, a reference cascode transistor M3,ref (n-channel MOSFET of the enhancement-mode type), a current mirror circuit 24 and also an additional transistor M8,ref. An operating voltage source 11, a cascode voltage source 9, a first current source 26 and a third current source 27 are furthermore provided.

In this case, too, the current mirror circuit 24 comprises two p-channel MOS field effect transistors M4,ref, M5,ref of the enhancement-mode type, the gates G4,ref and G5,ref of which are connected to one another.

Figure 5:
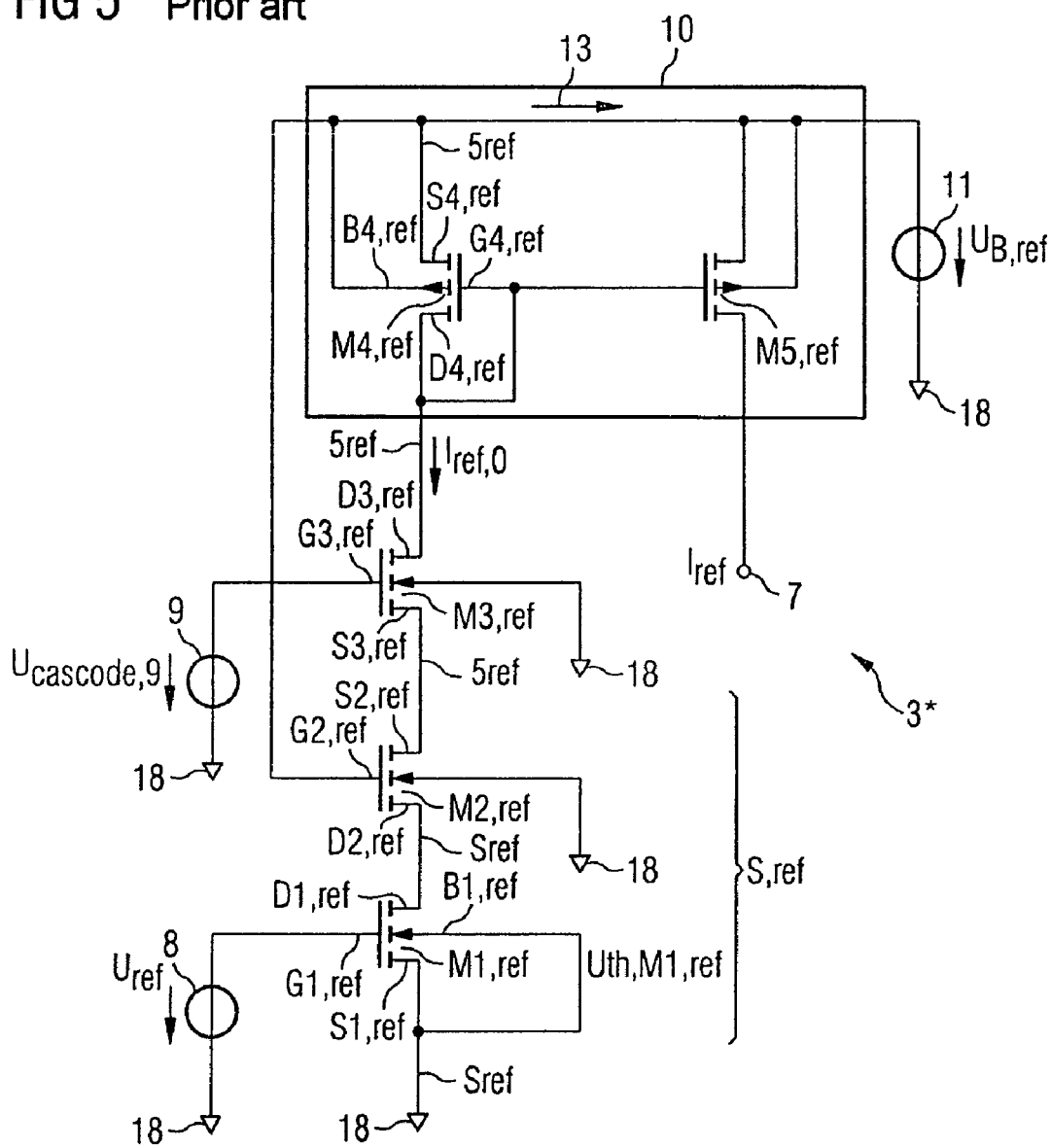
FIG. 5 shows a reference circuit arrangement for generating a reference current for reading from EEPROM memory cells in accordance with the prior art.

In a departure from the embodiment in accordance with the prior art, in the variant according to the invention, the gate G4,ref of the transistor M4,ref is not connected to the drain D4,ref thereof, rather the gate G5,ref of the transistor M5,ref, which does not lie in the read-out path simulation 5ref is connected to the drain D5,ref of said transistor M5,ref. Unlike in the circuit arrangement illustrated in FIG. 5, therefore, in the present exemplary embodiment, a current mirroring is possible only from the transistor M5,ref to the transistor M4,ref, but not in the opposite direction. This current mirror direction is identified with the aid of an arrow provided with the reference symbol 25.

The drain D1,ref of the reference memory transistor M1,ref is connected via the node a to the drain D2,ref of the reference high-voltage switching transistor M2,ref. The source S2,ref of the reference high-voltage switching transistor M2,ref of the reference memory cell $S_{ref}$ is connected via the node b to the source S3,ref of the reference cascode transistor M3,ref. The drain D3,ref of the reference cascode transistor M3,ref is connected via the node c to the drain D4,ref of the output-side transistor M4,ref of the current mirror 24.

The substrate terminals B1,ref, B2,ref and B3,ref of the n-channel transistors M1,ref, M2,ref, M3,ref each having a drain, source, gate and substrate terminal D1,ref . . . D3,ref, S1,ref . . . S3,ref, G1,ref . . . G3,ref, B1,ref . . . B3,ref are connected to reference potential 18. The substrate terminals B4,ref, B5,ref of all the p-channel transistors M4,ref, M5,ref each having a drain, source, gate and substrate terminal D4,ref, D5,ref, S4,ref, S5,ref, G4,ref, G5,ref, B4,ref, B5,ref are connected to operating voltage $U_{B,ref}$.

The source S1,ref of the reference memory transistor M1,ref of the reference memory cell $S_{ref}$ is at the reference potential 18. The two source terminals S4,ref, S5,ref of the transistors M4,ref, M5,ref of the reference current mirror 24, in the same way as the gate G2,ref of the reference high-voltage switching transistor M2,ref, are at the operating voltage $U_{B,ref}$ provided by a reference operating voltage source 11, said operating voltage being identical to the operating voltage $U_B$ provided by the operating voltage source 16 of the sense amplifier 2. The operating voltage $U_B=U_{B,ref}$ is generally approximately 5 V. A cascode voltage $U_{cascode,9}$ provided by a reference cascode voltage source 9 is present at the gate G3,ref of the reference cascode transistor M3,ref. Said cascode voltage $U_{cascode,9}$ is typically approximately $U_{cascode,9}=1.2$ V in the control state and dependent on the state of the memory cells.

The source S8,ref of the additional n-channel MOSFET M8,ref of the enhancement-mode type is connected to the gate G1,ref of the reference memory transistor M1,ref. The substrate terminal B8,ref of the reference memory transistor M1,ref is connected to the source terminal S8,ref of the reference memory transistor M1,ref. The drain D8,ref of the transistor M8,ref is at operating voltage potential $U_{B,ref}$. The gate G8,ref is connected to the node C and is thus connected to the drains D4,ref and D3,ref of the two transistors M4,ref and M3,ref.

In the present exemplary embodiment, the current mirror circuit 24 that is known in circuit technology represents the basic circuit component for the invention's principle of reference current generation.

Figure 2:
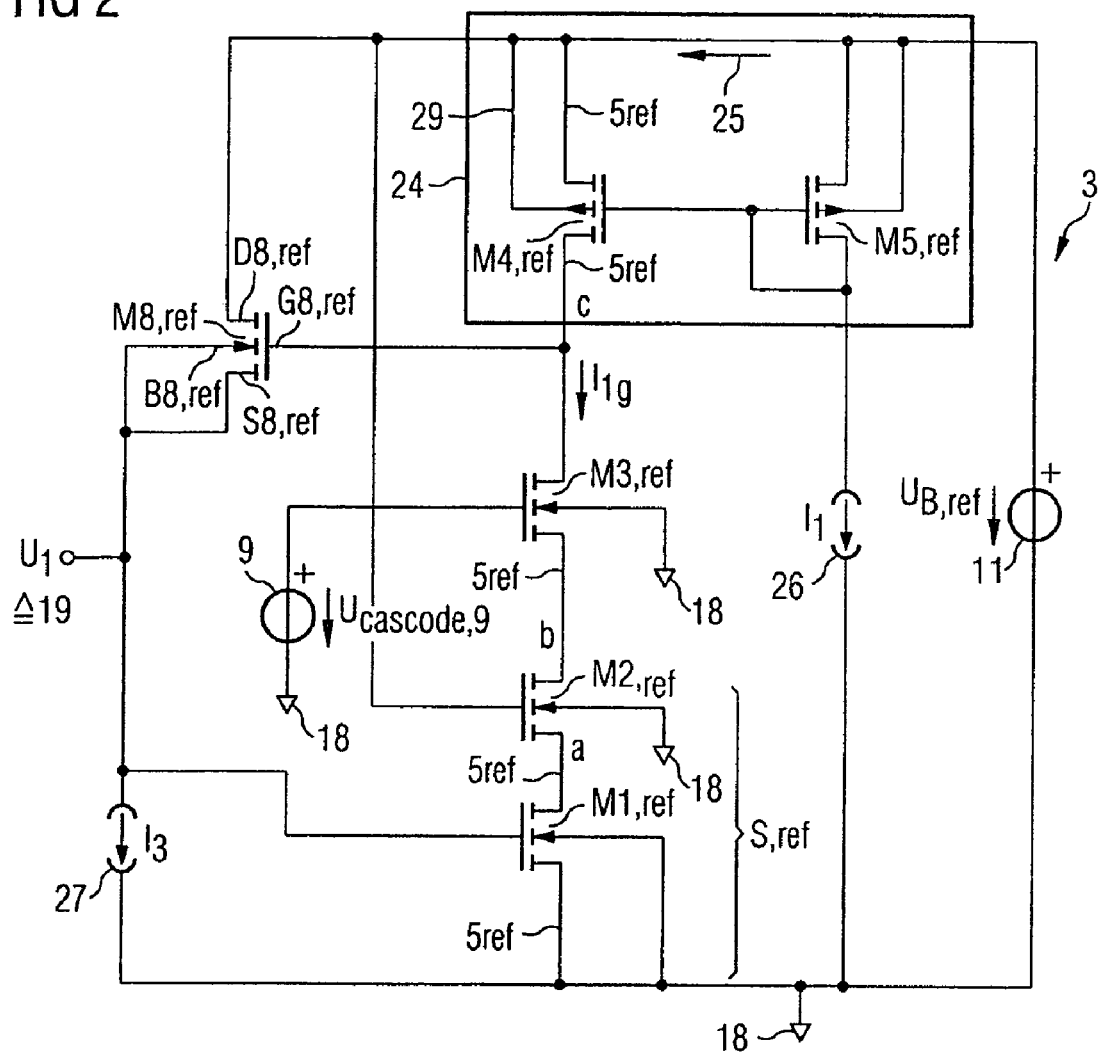
FIG. 2 shows a second exemplary embodiment of a reference circuit arrangement according to the invention for reading from EEPROM memory 10 cells.

A fixedly predetermined first current $I_1$ (for example from an on-chip current source 26) is impressed on the reference circuit arrangement 3 illustrated in FIG. 2 via the input transistor M5,ref of the current mirror circuit 24. In the current mirror circuit 24, said first current $I_1$ is mapped via the output-side mirror transistor M4,ref onto the read-out path simulation 5ref, where it flows as mirrored first current $I_{1g}$ in the read-out path simulation 5ref.

On account of said mirrored first current $I_{1g}$, a voltage $U_c$ is established at the node c depending on the strength of the normally on capability (e.g. threshold voltage ($U_{th,M1,ref}$) that can be altered by erasure according to the method specified above) of the reference memory transistor M1,ref, which voltage $U_c$ sets a reference voltage $U_1$ that is dependent on the reference memory transistor M1,ref with the aid of the source follower M8,ref. In this case, the third current source 27 with the current intensity $I_3$ serves for holding the source follower M8,ref at the operating point.

Said reference voltage $U_1$ is applied as read-out voltage $U_1$ to the memory transistor M1 e.g. in accordance with the circuit according to FIG. 4.

Assuming that the memory transistor M1 is in the same state (identical threshold voltage $U_{th,M1}$) as the reference memory transistor M1,ref, the read-out current $I_{read}$ generated by the memory transistor M1 corresponds, according to the current mirror principle, to the reference current $I_1$ from the on-chip current source 26 that is fixedly set in the reference circuit arrangement 3. It suffices, therefore, if the current $I_1$ generated by the on-chip source 26 is fed as reference current in the sense amplifier 2 in accordance to FIG. 2. In order to ensure the functionality described below, however, the current intensity $I_1$, depending on the required read-out speed, is approximately 10 to 20% greater than the reference current $I_{ref}$ which is required for the read-out method according to the prior art and which is provided by the circuit arrangement according to FIG. 5.

In order to set a certain reference voltage $U_1$, the reference memory transistor M1,ref is brought to a desired normally on state by erasure in a manner similar to that in the case of the method described above or the circuit arrangement described above for generating a reference current from a reference voltage in accordance with the prior art.

The reference voltage setting is effected in the manner described below:

The reference cascode transistor M3,ref ensures the operation of the reference memory transistor M1,ref in triode operation.

The erasure of the reference memory cell(s) $S_{ref}$ is effected by the gate G1,ref of the reference memory transistor M1,ref being put at reference potential 18 and an erase voltage (approximately 20 V) being momentarily applied to the source S1,ref of the reference memory transistor M1,ref. This process is repeated if appropriate multiply until it is ensured that the reference memory transistor is in the normally on state. Typically, only three cycles are sufficient to reach this state.

The resistance of the drain-source path of the transistor M1,ref is altered by erasure with different erase voltages. Consequently, the transistor chain M1,ref M3,ref can be regarded as current source with a variable current which sets the potential at node C (drain M3,ref, drain M4,ref). With the source follower M8,ref, a voltage $U_1$ corresponding to the resistance of the drain-source path of the transistor M1,ref is adjusted at the gate of the EEPROM transistor M1,ref in order that the currents through the transistors M3,ref, M4,ref become identical in magnitude. This means that the resistance of M1,ref will be established such that the current source M3,ref-M1,ref can "extract" the supplied current $I_{1g}$ from M4,ref, which has the consequence that the node C is in current equilibrium and a constant potential is established at this node C. Through M8,ref, moreover, the output impedance $r_{M8,ref}=1/gm_{M8,ref}$ formed by the reciprocal of the transconductance of the transistor M8,ref in a common-drain connection is kept low at the source S8,ref, which is an important criterion for a voltage reference.

Through application of this reference voltage generation, it is possible to eliminate the problems described above:

There is no need for so-called trimming during testing. The reference cells are subjected to some on-chip programming/erasure cycles prior to start-up in order to guarantee a defined identical state of all the cells. No current has to be adjusted (measured) during the erasure/programming sequence. The test time is thereby reduced, which reduces the production costs.

Furthermore, there is no need for any complicated examinations over the "operating window" of the EEPROM cells in order to guarantee a bias for temperature or operating voltage fluctuations or the like. This means that less bias is necessary for the reference current.

This leads to a reduction of the overall current consumption. The temperature and the operating voltage have no influence on the reference current. The read-out current remains constant. The overall current consumption likewise remains constant.

In the case of this circuit arrangement 3 according to the invention as shown in FIG. 2 it is particularly important to provide a voltage source for generating a suitable cascode voltage $U_{cascode}$. In order to ensure entirely satisfactory functioning of the reference voltage generation, it is necessary, moreover, to generate a cascode voltage $U_{cascode}$ which is able to compensate for process dependencies, temperature fluctuations and the possible occurrence of loss of charge (moving bit) of the reference memory cells $S_{ref}$. The cascode voltage that is predetermined with the control ensures the operation of the EEPROM transistor in the triode region.

Figure 3:
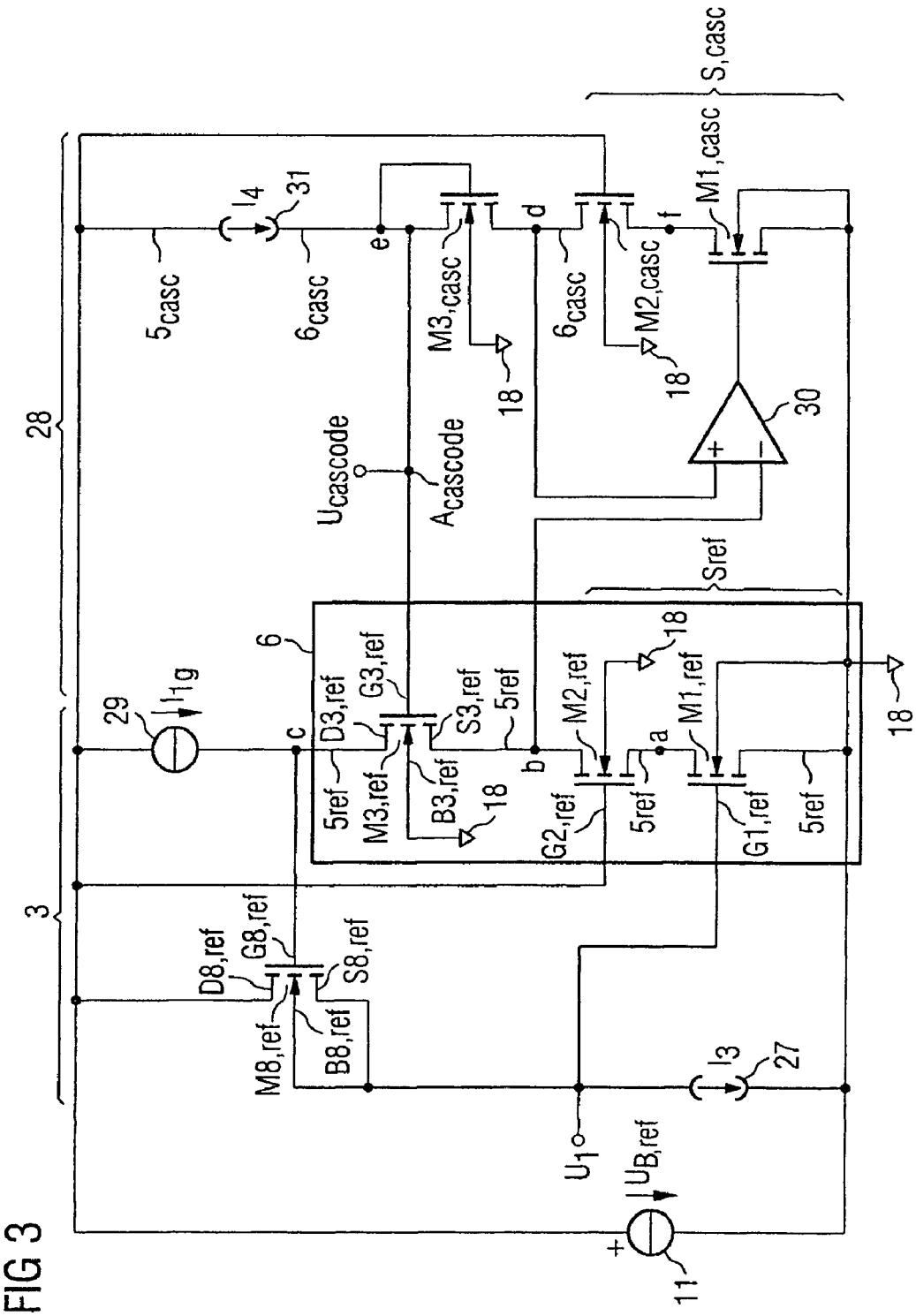
FIG. 3 shows an exemplary embodiment of a circuit arrangement according to the invention for generating a cascode voltage for a cascode transistor in a sense amplifier for reading out the content of EEPROM memory cells and for a cascode transistor in a reference voltage generating device.

FIG. 3 shows, besides the circuit 3 for reference voltage generation from FIG. 2, in addition a control circuit 28 for generating a cascode voltage $U_{cascode}$.

FIG. 3 depicts the essential constituent parts of the reference circuit arrangement 3, namely the transistors M1,ref, M2,ref, M3,ref and M8,ref connected via the nodes a and b. The current mirror circuit 24 in accordance with FIG. 2, via which the current $I_1$ is mirrored into the simulated read-out path 5ref, is symbolized by an equivalent current source 29 that supplies the mirrored current $I_{1g}$. The operating voltage source 11 that provides the operating voltage $U_{B,ref}$ is furthermore depicted on the left-hand side of the figure of the drawing.

The cascode voltage generating device 28 according to the invention comprises a differential amplifier 30, a current source 31 and also three n-channel MOSFETs of the enhancement-mode type M1,casc, M2,casc and M3,casc. The source-drain paths S1,casc, D1,casc, S2,casc, D2,casc, S3,casc, D3,casc and the fourth current source 31 that supplies a fourth constant current $I_3$ are cascade-connected at nodes d, e, f. The cascade-connected source-drain paths S1,casc, D1,casc, S2,casc, D2,casc, S3,casc, D3,casc of the transistors M1,casc, M2,casc, M3,casc and the fourth current source 31 arranged in series constitute a simulation of the reference path 5ref illustrated in FIG. 2 or 3 (that is to say ultimately a simulation of the read-out path 5). In contrast to the simulated memory transistor M1,ref, the control transistor M1,casc is a normal NMOS transistor and not an EEPROM transistor (memory transistor) in order to be able to dispense with further redundancy paths. Therefore, in contrast to the reference memory transistor M1,ref, the control transistor M1,casc does not have a "floating gate".

The gate G3,ref of the reference cascode transistor M3,ref is connected to the drain of the simulated reference cascode transistor M3,casc.

Furthermore, the node d is connected to the noninverting input of the differential amplifier 30. The node b is connected to the inverting input of the differential amplifier 30. The output of the differential amplifier 30 is connected to the gate of the control transistor M1,casc.

The cascode voltage $U_{cascode}$ is generated by means of the current source 31 that provides the fourth current $I_4$, the MOS diode M3,casc and the transistor M1,casc that is controlled in the triode region. In this case, the differential amplifier 30 drives the gate of M1,casc and in this way controls the channel resistance thereof in such a way that nodes b and d are at the same potential.

FIG. 1 shows a further exemplary embodiment of a reference circuit arrangement 33 according to the invention for generating a reference voltage for reading from EEPROM memory cells.

In addition to the reference circuit arrangement 3, FIG. 1 shows a four-bit memory column 4 having four memory cells Sa, Sb, Sc, Sd, and an associated sense amplifier 2 of the type described above.

Like the memory cell S described above, the four memory cells Sa, Sb, Sc, Sd in each case comprise an EEPROM memory transistor M1a, M1b, M1c, M1d and also an associated high-voltage switching transistor M2a, M2b, M2c, M2d, the source-drain paths of which are connected in series in each case in a manner forming a read-out path 5a, 5b, 5c, 5d.

The four memory cells Sa, Sb, Sc, Sd are connected in parallel and the read-out paths 5a, 5b, 5c, 5d are connected to one another at the respective drain terminal of the high-voltage switching transistors M2a, M2b, M2c, M2d via a bit line 1. The respective source terminals of the memory transistors M1a, M1$^b$, M1c, M1d are connected to a reference potential 18.

The respective gate terminals of the high-voltage switching transistors M1a, M1b, M1c, M1d are connected to a bus line 32 via which a respective one of the memory cells Sa, Sb, Sc, Sd can be driven with the aid of a corresponding control voltage $U_{sel}$.

The bit line 1 is connected to the source of a cascode transistor M3. The drain of the cascode transistor M3 is connected to the drain of an input-side mirror transistor M4 with gate fed back to the drain. The source thereof is connected to a reference voltage source 16 that provides a reference voltage $U_B$. The channel of the mirror transistor M4, the channel of the cascode transistor M3 that is connected thereto, and the channels of the high-voltage switching transistor M2a, M2b, M2c or M2d and of the memory transistor M1a, M1b, M1c or M1d of the corresponding selected memory cell Sa, Sb, Sc or Sd form a read-out path 5 and 5a, 5b, 5c or 5d.

The mirror transistor M and a transistor M5, which is likewise connected to the operating potential 16 by its source, form a current mirror circuit 12 by means of their gate coupling.

Two further transistors M6 and M7, the source terminals of which are connected to reference potential 18 and the gate terminals of which are connected to one another, form a further current mirror circuit 14.

The drain terminals of the two transistors M5 and M7 are connected to one another at a node g. These form a current comparator 22 that has already been described above with regard to FIG. 4.

A reference current source 33 is furthermore provided, by means of which a reference current $I_{ref}$ is fed into the drain of the transistor M6.

In the present example, the reference circuit arrangement 3 comprises eight (symbolized by the designation "8x") read-out path simulations 5a,ref, 5b,ref, ... 5h,ref of the type illustrated in FIG. 2 with simulated reference memory transistors M1a,ref, M1b,ref, M1h,ref, reference high-voltage switching transistors M2a,ref, M2b,ref ... M2h,ref and reference cascode transistors M3a,ref, M3b,ref ... M3h,ref which are simulated in a manner corresponding to a memory transistor M1a, M1b, M1c, M1d, a read-out transistor M2a, M2b, M2c, M2d and the cascode transistor M3 and are arranged in corresponding reference paths 6a, 6b, 6c ... 6h.

In the present exemplary embodiment, the transistor chain M1,ref-M2,ref-M3,ref is positioned eight times in order, upon the possible occurrence of a loss of charge (moving bit) at the floating gate of a reference memory cell Sa,ref, Sb,ref ... Sh,ref, still to have seven redundant reference memory cells Sa,ref, Sb,ref . . . Sh,ref which generate the reference voltage $U_1$, as is described below:

In the case of a moving bit, the threshold voltage $U_{th,M1a,ref}$, $U_{th,M1b,ref}$ . . . $U_{th,M1h,ref}$ of the corresponding reference memory transistor M1a,ref, M1b,ref . . . M1h,ref is increased by the loss of charge of the floating gate, which leads to a lower current-carrying capacity of the reference memory transistor M1a,ref, M1b,ref, . . . M1h,ref. To put it another way, the channel resistance of the corresponding reference memory transistor M1a,ref, M1b,ref, . . . M1h,ref increases in comparison with the intact reference memory transistors M1a,ref, M1b,ref, . . . M1h,ref.

In this case, the current $I_{1ga}$, $I_{1gb}$, $I_{1gc}$, $I_{1gd}$, $I_{1ge}$, $I_{1gf}$, $I_{1gg}$, $I_{1gh}$ fed in for eight reference cells is divided between seven cells, which results in a current increase per reference memory cell Sa,ref, Sb,ref . . . Sh,ref of 12.5% (⅛). As a result of the cascode control, the cascode voltage is increased by 12.5%, so that the circuit is once again at its original operating point (cf. all reference cells intact).

Ideally, the reference voltage does not change in the case of a moving bit!

The functioning of the cascode control emerges in detail as follows:

As also emerges in particular from the above description with regard to FIG. 3, the reference path 6 formed by the transistors M1,ref-M3,ref is once again simulated with the aid of the transistors M1,casc-M3,casc in a manner forming a cascode generating path 6casc. The cascode voltage Ucascode is generated by means of the current source 31 providing the fourth current $I_4$, the MOS diode M3,casc and the transistor M1,casc controlled in the triode region. In this case, the differential amplifier 30 drives the gate of the control transistor M1,casc and, in this way, controls the channel resistance thereof in such a way that nodes b and d are at the same potential.

If a reference cell were then to fail and the current were increased by 12.5% on the remaining cells, then as a consequence the potential at the node b would also rise by this 12.5% (constant resistance of M1,casc through reference voltage control). As a result of this voltage difference at nodes b and d, the differential amplifier 30 decreases the gate voltage at the transistor M1,casc and thus increases the channel resistance thereof, which in turn permits the potential at the node b to rise until the differential voltage between b and d is equal to zero again. In the settled state, node d (with the cascode voltage $U_{cascode}$) has increased precisely by the change at node b—brought about by the current change—by 12.5%. Since the control transistor M1,ref operates in the triode region, ideally linear changes take place.

LIST OF REFERENCE SYMBOLS

1 Bit line
2 Sense amplifier
3 Reference circuit arrangement
3* Reference circuit arrangement in accordance with the prior art
4 Four-bit memory column
5 Read-out path
5a–5d Read-out path
$5a_{ref}$–$5h_{ref}$ Read-out path simulation
$5_{casc}$ Read-out path simulation for cascode voltage generation
$5_{ref}$ Read-out path simulation
6 Reference path
6a–6h First to eighth reference path
$6_{casc}$ Reference path simulation
7 Reference current source
8 Reference voltage source
9 Cascode voltage source
10 Current mirror circuit
11 Operating voltage source
12 Current mirror circuit
13 Current mirror direction
14 Current mirror circuit
15 Current mirror direction
16 Operating voltage source
17 Current mirror direction
18 Reference potential
19 Voltage source
20 Selection voltage source
21 Cascode voltage source
22 Current comparator
23 Comparator current path
24 Current mirror circuit
25 Current mirror direction
26 First current source
27 Second current source
28 Cascode voltage generating device
29 Equivalent current source
30 Differential amplifier
31 Fourth current source
32 Bus line
33 Third current source
34 Current sink
(A)–(E) Connection points of FIG. 1a to FIG. 1b
a–g Node
$A_{cascode}$ Output of the cascode voltage generating device
$A_{out}$ Current comparator output
B1 . . . B7 Bulk/substrate
B1,casc–B3,casc Bulk/substrate
B1,ref–B5,ref Bulk/substrate
B8,ref Bulk/substrate
D1–D7 Drain
D1,casc–D3,casc Drain
D1,ref–D5,ref Drain
D8,ref Drain
G1–G7 Gate
G1,casc–G3,casc Gate
G1,ref–G5,ref Gate
G8,ref Gate
$I_1$ Reference current
$I_{1g}$ Mirrored reference current
$I_{1ga}$ . . . $I_{1gh}$ Mirrored reference current
$I_2$–$I_4$ Currents
$I_{read}$ Read current
$I_{read,0g}$ Read current mirrored
$I_{ref}$ Reference current
$I_{ref,0}$ Reference current
$I_{ref,0g}$ Reference current mirrored
$I_{target}$ Target current intensity
K Input node
Ka–Kd Input node
M1 Memory transistor
M1,casc Memory transistor simulation for cascode voltage generation=control transistor
M1,ref Reference memory transistor
M1a–M1d Memory transistor
M1a,ref–M1h,ref Reference memory transistor
M2 High-voltage switching transistor
M2,casc High-voltage switching transistor simulation for cascode voltage generation
M2,ref Reference high-voltage switching transistor M2a–M2d High-voltage switching transistor
M2a,ref Reference high-voltage switching transistor
M2b,ref–M2h,ref Reference high-voltage switching transistor
M3 Cascode transistor
M3,casc Cascode transistor simulation for cascode voltage generation
M3,ref Reference cascode transistor
M3a,ref–M3h,ref Reference cascode transistor
M4 Mirror transistor
M4,ref Reference mirror transistor
M5 Mirror transistor
M5,ref Mirror transistor
M6 Mirror transistor
M7 Mirror transistor
M8,ref Source follower transistor
S Memory cell
S1–S7 Source
S1,casc–S3,ref Source
S1,ref–S5,ref Source
S8,ref source
Sa first memory cell
Sa,ref first reference memory cell
Sb second memory cell
Sb,ref second reference memory cell
Sc third memory cell
Sc,ref third reference memory cell
Sd fourth memory cell
Sd,ref fourth reference memory cell
Se,ref fifth reference memory cell
Sf,ref sixth reference memory cell
Sg,ref seventh reference memory cell
Sh,ref eighth reference memory cell
$U_1$ reference voltage
$U_B$ operating voltage
$U_{B,ref}$ operating voltage of reference circuit arrangement
$U_{cascode}$ cascode voltage
$U_{cascode,21}$ cascode voltage
$U_{cascode,9}$ cascode voltage
$U_{out}$ output voltage
$U_{ref}$ reference voltage
$U_{sel}$ selection voltage
$U_{th}$ threshold voltage
$U_{th,M1}$ threshold voltage of the transistor M1
$U_{th,M1,ref}$ threshold voltage of the transistor M1,ref

The invention claimed is:

1. A method for reading out the content of a flash/EEPROM memory cell, in which a read current flowing via a read-out path is compared with a reference current flowing via at least one read-out path simulation, the read-out path having a memory cell with a memory transistor, and the read-out path simulation having a reference memory cell simulating the memory cell with a reference memory transistor corresponding to the memory transistor, the method comprising:
   a) causing the reference memory transistor to a normally on state provided that the reference memory transistor is not already in the normally on state;
   b) providing a predetermined reference current to the at least one read-out path simulation;
   c) generating, with the aid of the predetermined reference current, a reference voltage that is dependent on the channel resistance of the reference memory transistor, wherein when the reference memory transistor is in a triode operation, the reference voltage is substantially proportional to the channel resistance, and wherein when the reference memory transistor is in a saturated operation, the reference voltage rises with the channel resistance according to a root function;
   d) providing the reference voltage to a gate of the memory transistor and a gate of the reference memory transistor; and
   e) comparing the read current flowing through the memory transistor with the predetermined reference current flowing through the reference memory transistor.

2. The method as claimed in claim 1, wherein step a) further comprises applying an erase voltage to a source of the reference memory transistor while the gate of the reference memory transistor is connected to a reference potential.

3. The method as claimed in claim 1, wherein step b) further comprises providing a predetermined reference current to eight read-out path simulations.

4. The method as claimed in claim 1, wherein step b) further comprises providing the predetermined reference current to the at least one read-out path simulation via a current mirror.

5. The method as claimed in claim 1, wherein step c) further comprises generating the reference voltage using a voltage follower circuit.

6. The method of claimed in claim 5, wherein the voltage follower circuit includes an emitter follower transistor.

7. The method as claimed in claim 1, wherein step e) further comprises mirroring the read current prior to comparing the read current with the predetermined reference current.

8. The method as claimed in claim 1, further comprising:
   with the aid of a cascode transistor having a gate driven by a cascode voltage, a defined potential is set at an input node of the memory cell,
   with the aid of a respective corresponding reference cascode transistor corresponding to the cascode transistor, the reference cascode transistor having a gate driven by the cascode voltage, a second defined potential is set at an input node of a respective reference memory cell,
   wherein the cascode voltage is generated by a predetermined current being fed into a further read-out path simulation having a further simulated cascode transistor and a further simulated memory cell, the further simulated memory cell comprising a control transistor simulating a memory transistor with a further input node.

9. An apparatus for reading out the content of a flash/EEPROM memory cell, comprising:
   a comparison device configured to compare a read current flowing via a read-out path with a reference current flowing via at least one readout path simulation, the read-out path having a memory cell with a memory transistor, and the read-out path simulation having a reference memory cell corresponding to the memory cell, the reference memory cell having a reference memory transistor corresponding to the memory transistor,
   a current source configured to feed a predetermined reference current into the at least one read-out path simulation after the reference memory transistor is brought to a normally on state when the reference memory transistor is not already in the normally on state,
   a circuit device configured to generate, with the aid of the predetermined reference current, a reference voltage that is dependent on the channel resistance of the reference memory transistor, wherein when the reference memory transistor is in a triode operation, the reference voltage is substantially proportional to the channel resistance, and wherein when the reference memory transistor is in a saturated operation, the reference voltage rises with the channel resistance according to a root function, the circuit device further configured to provide the reference voltage to a gate of the memory transistor and a gate of the reference memory transistor, and wherein the comparison device is configured to compare the read current flowing through the memory transistor with the predetermined reference current flowing through the reference memory transistor when the reference voltage is provided to the gate of the memory transistor and the gate of the reference memory transistor.

10. The apparatus as claimed in claim 9, further comprising:

means for bringing the reference memory transistor to the normally on state by connecting the gate of the reference memory transistor to a reference potential and applying an erase voltage to a source of the reference memory transistor.

11. The apparatus as claimed in claims 9, wherein the current source is configured to feed a predetermined reference current into eight read-out path simulations.

12. The apparatus as claimed in claim 9, further comprising a current mirror configured to provide the predetermined reference current to the at least one read-out path simulation.

13. The apparatus as claimed in claim 12, wherein the circuit device further comprises a voltage follower circuit configured to generate the reference voltage dependent on the channel resistance of the reference memory transistor.

14. The apparatus as claimed in claim 12, further comprising a second current mirror operably coupled to provide the read current flowing through the memory transistor to the comparison device.

15. The apparatus as claimed in claim 13, wherein the voltage follower circuit further comprises a source follower transistor or an emitter follower transistor.

16. The apparatus as claimed in claim 9, wherein the circuit device further comprises a voltage follower circuit configured to generate the reference voltage dependent on the channel resistance of the reference memory transistor.

17. The apparatus as claimed in claim 16, wherein the voltage follower circuit further comprises a source follower transistor or an emitter follower transistor.

18. The apparatus as claimed in claim 9, further comprising a current mirror operably coupled to provide the read current flowing through the memory transistor to the comparison device.

19. The apparatus as claimed in claim 9, further comprising:

a cascode transistor having a gate driven by a cascode voltage, the cascade transistor operable to set a defined potential at an in put node of the memory cell, a respective corresponding reference cascode transistor having a gate driven by the cascode voltage, the reference cascode transistor configured to set a defined potential at an input node of a respective reference memory cell, a cascode voltage generating device configured to generate the cascode voltage, the cascade voltage generating device including, a current source configured to feed a predetermined current into a further readout path simulation having a further simulated cascode transistor and a further simulated memory cell, a comparison and control device configured to compare the voltage at the input node of a respective reference memory cell with a voltage at a further input node of the further simulated memory cell, and, through corresponding driving of a gate of the control transistor, to alter the channel conductivity of the control transistor until the voltage at the input node of a respective reference memory cell matches the voltage at the further input node, and an output device configured to output the voltage at the drain of the further simulated cascode transistor as the cascode voltage.

* * * * *